United States Patent [19]

Mayo, Jr.

[11] Patent Number: 4,690,150

[45] Date of Patent: Sep. 1, 1987

[54] PRODUCING PSEUDOCOLOR IMAGES FOR DIAGNOSTIC ULTRASOUND IMAGING

[75] Inventor: William T. Mayo, Jr., Seal Beach, Calif.

[73] Assignee: North American Philips Corporation, New York, N.Y.

[21] Appl. No.: 767,457

[22] Filed: Aug. 20, 1985

[51] Int. Cl.$^4$ .............................................. A61B 10/00
[52] U.S. Cl. ..................................... 128/660; 358/82; 358/112
[58] Field of Search .................................. 73/599–600; 128/653, 659–661, 663–664; 343/5 CD; 358/81–82, 110–113; 364/521; 367/11

[56] References Cited

U.S. PATENT DOCUMENTS

| 4,183,046 | 1/1980 | Dolke et al. | 358/81 X |
| 4,415,922 | 11/1983 | Raymond et al. | 358/81 X |
| 4,543,826 | 10/1985 | Ferrari | 128/660 X |
| 4,584,880 | 4/1986 | Matzuk | 128/660 X |

FOREIGN PATENT DOCUMENTS 100094  2/1984  European Pat. Off. ............ 128/660

OTHER PUBLICATIONS

Sams, H. W. "Color TV Training Manual", Chapter 1, Howard Sons & Company, Indianapolis, Ind. ©1970, pp. 9–21.

Primary Examiner—Kyle L. Howell
Assistant Examiner—Francis J. Jaworski
Attorney, Agent, or Firm—Jack E. Haken

[57] ABSTRACT

A method for displaying the values of two parameter at a plurality of points in an image. The intensity of each pixel in the display is modulated in accordance with the value of the first parameter at corresponding points in the image. The hue of each pixel is modulated to a first color whenever the value of the second parameter at the corresponding point in the image is greater than a reference value and to a second color whenever the value of the second parameter is less than the reference value. The saturation at each pixel is modulated as a function of the absolute value of the deviation of the second parameter from the reference value at the corresponding point in the image. In a preferred embodiment, the first parameter corresponds to the amplitude of echoes in a diagnostic ultrasound image and the second parameter corresponds to the instantaneous frequency deviation of the echoes.

8 Claims, 4 Drawing Figures

PRODUCING PSEUDOCOLOR IMAGES FOR DIAGNOSTIC ULTRASOUND IMAGING

The invention relates to a method and apparatus for displaying data. More particularly, the invention relates to a method and apparatus for producing a display wherein each pixel represents the values of two independent parameters at a corresponding point in an image. The invention is particularly useful for displaying diagnostic ultrasound images when the first parameter is the amplitude of an ultrasound echo signal and the second parameter is the instantaneous frequency deviation of the echo signal.

BACKGROUND OF THE INVENTION

It is well known that pseudocolor enhances human perception of gray scales and enables an observer to quantify a single parameter image. However, it is also known that most medical radiologists do not like pseudocolor images.

Electronic Picture Archiving and Communication Systems (PACS) provide a convenient mechanism for storing multicolor images and ultrasound flow visualization systems now demonstrate the necessity for color displays when more than one independent parameter must be simultaneously displayed. It has been shown that color can allow the eye-brain combination to form useful correlations on multiparameter image data, if it can be used in a pleasing manner.

It is known that separate use of red, green and blue to image three independent variables leads to confusing images. A more natural presentation is used in commercial color television and in map making where a primary image is shown as a high (spatial) resolution intensity image and secondary parameters are visualized by color tinting (which typically has less spatial resolution than the primary image). Thus, the hue (color) and the saturation (purity of color) can be used to present two independent low-resolution variables which are superimposed on a high resolution intensity image.

FIG. 1 schematically illustrates a two-dimensional chromaticity space of hue and saturation in polar coordinates. In the figure, S=0 is white (zero color saturation) and the circle S=1 represents pure monochromatic colors (fully saturated). In this model, locations near S=0 are pastel colors.

In the prior art, three parameters of position in an image (such as a(x,y), f(x,y) and g(x,y)) were respectively assigned to Intensity, Hue and Saturation as, for example:

Intensity: $I(x,y) = K_i \, a(x,y)$ (1)

Hue: $H(x,y) = K_h \, f(x,y)$ (2)

Saturation: $S(x,y) = K_s \, g(x,y)$ (3)

where $K_i$, $K_h$, and $K_s$ were constants.

The simplest use of these relations is to set S=0 everywhere (which implies that the hue is irrelevant) black and white intensity images are thus produced from the function a(x,y).

In the usual prior art pseudocolor display, the single parameter, I(x,y) is set to a constant, S is set to unity (fully saturated color), and the parameter f(x,y) is imaged with hue as the only variable. Many people find such images distasteful.

In a more acceptable prior art method, "color tinting" of a gray scale image is accomplished using all three equations. If only one additional parameter is of interest, it is common to set S equal to a constant and to use H(x,y) as the parametric variable. Thus color tinting of a black and white image conveys low resolution information as an overlay through which the observer can see the usual image of intensity information a(x,y) in the same manner as color tinted black and white photographs. If S is chosen as unity, this scheme is still unsatisfying to many observers. More pleasing images have been formed if S is set to a small value which leaves all colors as unsaturated pastels.

In medical ultrasound, conventional pulsed-echo instruments display a monochrome image of the envelope of the RF echo signal which is returned from the body. Isolated point scatterers and large, reflecting interfaces thus show up as points or lines. The image represents a slice which is perpendicular to a plane swept out by the ultrasound beam. The resolution cell is formed by the RF pulse length (in the axial direction) and the diffraction limited lateral focus of the transducer aperture after any propagation distortions (attributable for example to refractive index variations in the body).

Living human tissue possesses a significant frequency dependent attenuation characteristic which is normally modeled, (to a first approximation) in healthy liver tissue, as linear with a slope of approximately 0.5 db/cm/MHz. As an example, at 3 MHz, the attenuation for a "normal" human liver tissue is 1.5 db/cm in each direction or 3 db/cm for round trip pulse echoes. A 20 cm path depth thus requires a time-gain-compensation (TGC) amplifier with a 60 db gain increase over the time of the return signals after the transmit pulse. When a broadband RF pulse is transmitted, lower frequency components of the signal are attenuated less than the high frequency components. Thus, the spectral centroid (and hence the average instantaneous frequency) of the echoes shifts downward as a function of the depth of the reflector.

It has been hypothesized that diseased livers have physical structures which may scatter and attenuate ultrasound energy in different manner than healthy tissue. Numerical tissue characterization methods have attempted to measure the attenuation down-shift separately from gross tissue structures and to avoid non-homogeneous regions of tissue (such as central portions of the liver).

SUMMARY OF THE INVENTION

In accordance with the invention, a combination of hue and saturation coding is used to overlay a secondary parameter display on an intensity modulated display of a primary parameter. The method provides a pleasing and useful color mapping which is particularly useful to display frequency shift information in conjunction with a display of the intensity of reflected ultrasound pulses. The method can also be used, for example, to overlay parametric information such a temperature or elevation in other views such as aerial photographs or primary radar images.

In accordance with the present invention, a second parameter f(x,y) is used to tint an intensity image I(x,y)=a(x,y) with a combination of hue and saturation parameters so that the hue is determined by the sign of the deviation of the value of the second parameter from a reference value, $f_0$, and the saturation is proportional to the absolute value of that deviation. For example:

when $f(x,y) < f_0$: $H(x,y) = $ Blue $$S(x,y) = C_1 \frac{f_0 - f(x,y)}{(f_0 - f_{min})}$$

and when $f(x,y) > f_0$: $H(x,y) = $ Red $$S(x,y) = C_1 \frac{f(x,y) - f_0}{(f_{max} - f_0)}$$

where $C_1$, $f_{max}$, $f_{min}$, and $f_0$ are constants. Thus, as f increases from its minimum to its maximum, the chromaticity follows a path, as illustrated in FIG. 1, from a relatively saturated blue through the pastel shades of blue through white and then through a pastel and into a relatively saturated red color. Any radial path inward from a saturated color to white and out again along another radial path to some contrasting color may be used. FIG. 1 illustrates a path from blue through red. In a preferred embodiment, the path begins and ends at somewhat unsaturated pastel colors as this seems to provide a more pleasing image.

The principle features of the image are:

(1) when there is no deviation of the secondary parameter from its reference or equilibrium value, then the image is black and white without color tint; and (2) color deviations have a linear (one dimensional) directional sense (for example: from blue to red) which may be associated mentally as left-right, up-down, hot-cold, good-bad, big-little, etc. instead of the sometimes disorienting "circular loop" which occurs when hue modulation alone is used.

DESCRIPTION OF THE DRAWINGS

The invention may be understood with reference to the attached drawings in which.

DESCRIPTION OF THE PREFERRED EMBODIMENT

Figure 2:
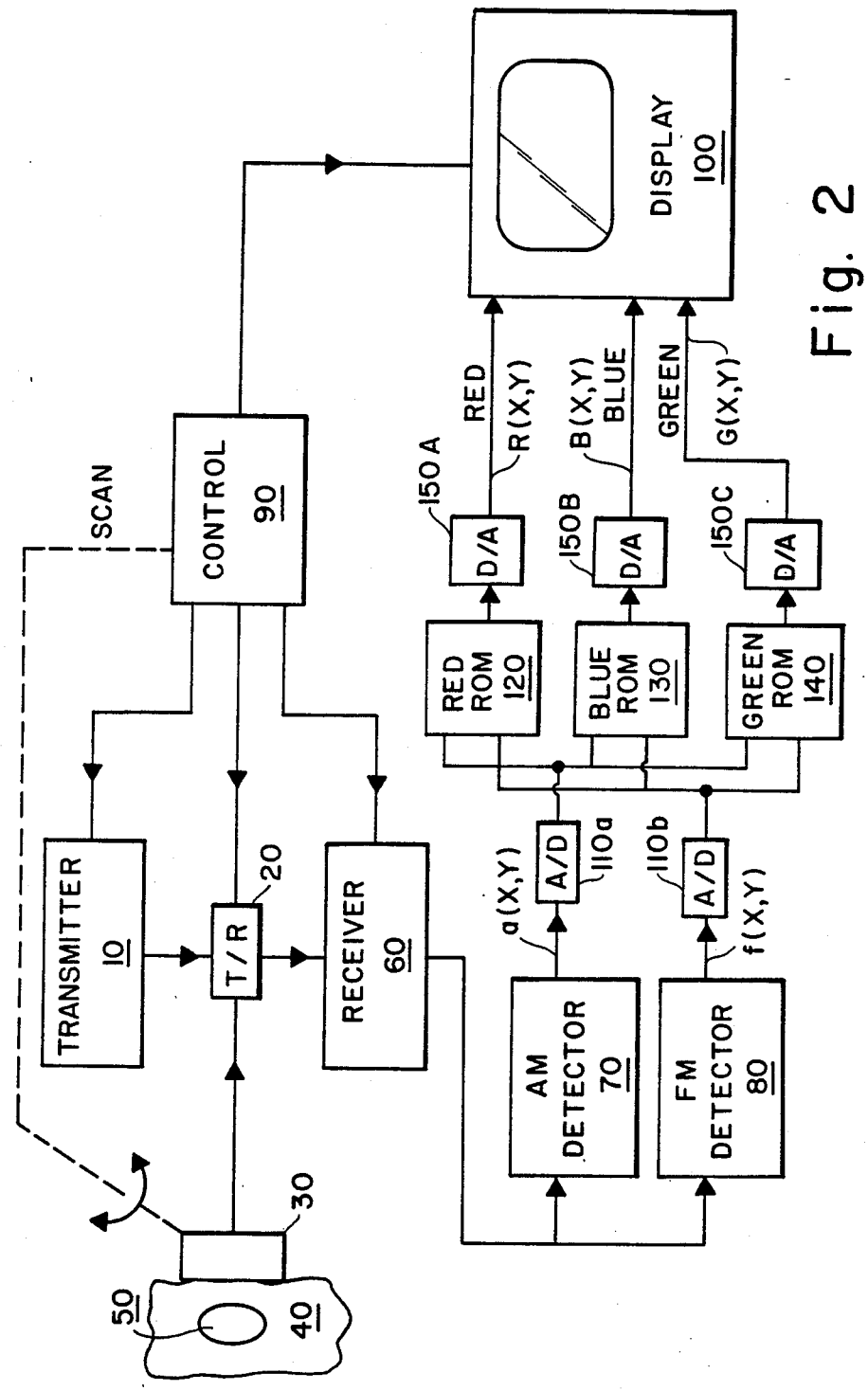
FIG. 2 is an echo ultrasound system which incorporates the invention.

FIG. 2 is a block diagram of an echo ultrasound imaging system which incorporates the present invention. A transmitter 10 generates radio frequency electrical pulses which are directed via a T-R switch 20 to an ultrasound transducer 30. The transducer converts the electrical pulses into pulses of ultrasound energy which are directed into a body undergoing examination 40. Portions of the ultrasound energy emitted from the transducer 30 are reflected from structures in the body (indicated schematically as 50) and are returned as echoes to the transducer 30. The transducer converts the echoes into electrical echo signals which are transmitted via the T-R switch 20 to a receiver 60 where they undergo amplification and signal processing in a conventional manner. The output signals from the receiver 60 are conveyed to an AM detector 70 and to an FM detector 80. The AM detector may be of the conventional type utilized in prior art pulse-echo ultrasound systems and may include time gain compensation (TGC) circuitry. The transmitter 10 and receiver 60 operate under the influence of signals from control circuits 90. The control circuits also causes the beam of ultrasound from the transducer 30 to oscillate in a plane to generate a conventional sector scan of the body. In a preferred embodiment the transducer may be motor driven to steer the ultrasound beam. Alternately, stepped or phased array techniques may be utilized to steer the beam. A sweep signal from the control circuitry 90 is connected to a color display unit 100, which may be an RGB CRT display. In a conventional manner, the sweep signal from the control circuitry 90 scans the electron beam on the face of the CRT so that its instantaneous position maps pixels on the face of the tube which correspond to the points in the body from the corresponding echo signals (which produce the outputs from the AM detector 70 and the FM detector 80) originate.

The output signals, a(x,y) from the AM detector 70 and f(x,y) from the FM detector 80, are digitized, respectively, in A to D converters 110a and 110b. The outputs from the A to D converters 110a and 110b are fed to the address inputs of three ROM memories 120, 130 and 140. The ROM memories 120, 130 and 140 respectively contain look-up tables which are translate the combined signals produced by the outputs of the AM detector and FM detector into intensity values which are applied, via D to A converters 150a, 150b and 150c to modulate the intensity of the red, blue and green electron guns of the color CRT.

Figure 1:
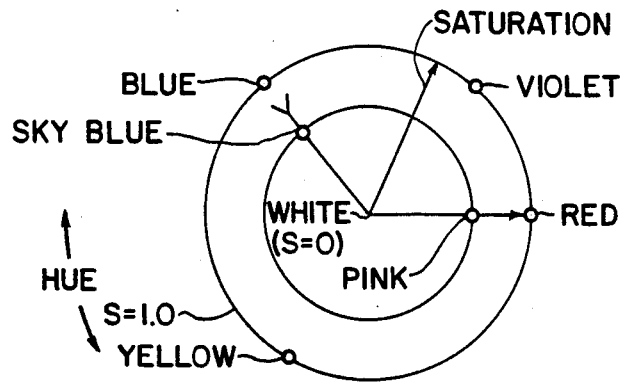
FIG. 1 is a simplified chromaticity diagram which illustrates the invention.
Figure 3A:
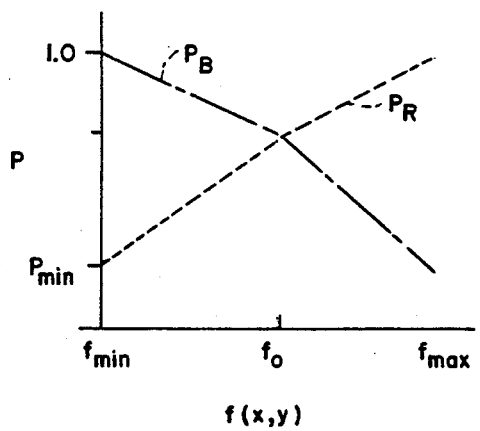
FIGS. 3a and 3b are plots of RGB multiplier values.
Figure 3B:
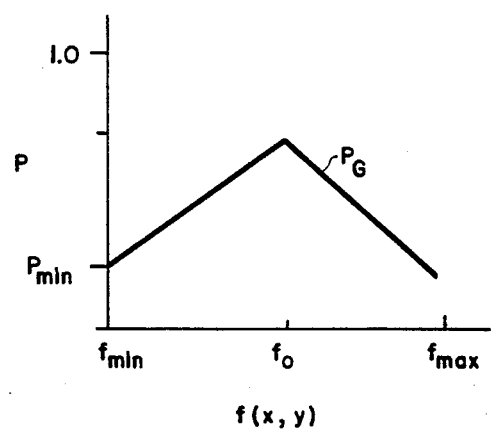

In a preferred embodiment of the invention, the look-up tables in the ROM memories 120, 130, and 140 respectively generate a red signal, R(x,y), a blue signal B(x,y), and a green signal G(x,y) in accordance with the formulas $$I(x,y) = K_i \, a(x,y)$$

$$R(x,y) = P_R(x,y) \, I(x,y)$$

$$G(x,y) = P_G(x,y) \, I(x,y)$$

$$B(x,y) = P_B(x,y) \, I(x,y)$$

where the multipliers $P_R$, $P_G$ and $P_B$ are all less then unity and are functions of f(x,y) determined according to the mapping illustrated by the straight lines in FIG. 3a and 3b. When $P_{min}$ differs from zero, maximum saturation is not obtained. When the output of the FM detector indicates that the center frequency of the return echoes is equal to the nominal center frequency of the echo signal, $f_0$, all three color guns are balanced to produce a nominally white pixel.

As illustrated in FIG. 3a, it is also possible to obtain a particularly pleasing modulation scheme by varying the value of $P_W$. That is to say the value of the intensity (I = R + G + B) is in fact slightly modulated by f(x,y).

In a preferred embodiment the invention was implemented on a Hewlett-Packard Model 9040 computer using a Recognition Concepts Trapix 5500 digital display system. Data was obtained from a 3 MHz 19 millimeter transducer operating in a Philips SDU 3000 ultrasound display system. The data was digitized to eight bits while scanning a "normal" human liver and kidney. Pleasing imaging were obtained with the parameters illustrated in FIG. 3 set to $P_w=0.5$, $P_{min}=0.12$, $F_{min}=2.25$ MHz, and $F_{max}=2.75$ MHz.

I claim:

1. Ultrasound imaging apparatus comprising:
   first means which direct a beam of ultrasound energy into a region of a body and which detect echoes of the energy which are reflected from structures within the body;

second means which process the detected echoes to produce a first signal, $a(x,y)$, where x and y are spatial coordinates of the reflecting structures, which represents the instantaneous amplitude of the detected echoes;

third means which process the detected echoes to produce a second signal, $f(x,y)$, which represents the deviation of the instantaneous frequency of the echoes which originate from points x,y from a reference frequency, $f_0$;

fourth means which scan the beam with respect to the body and which produce an image wherein positions of pixels map corresponding spatial coordinates (x,y) in the body;

fifth means which receive the first signal and which modulate the intensity of each pixel in the image with corresponding values of the first signal; and sixth means which receive the second signal and which modulate the color of each pixel in the image with the corresponding values of the second signal so that the hue of that pixel assumes a first color when the value of the second signal is positive and assumes a second complementary color when the value of the second signal is negative and which modulate the saturation of that pixel as a function of the corresponding absolute value of the second signal.

2. The apparatus of claim 1 where the first color is red and the second color is blue.

3. The apparatus of claim 1 wherein the sixth means modulate the saturation, $S(x,y)$, in accordance with the formulae:

$$S(x,y) = C_1 \frac{f_0 - f(x,y)}{(f_0 - f_{min})} \text{ when } f(x,y) < f_0$$

and $$S(x,y) = C_1 \frac{f(x,y) - f_0}{(f_{max} - f_0)} \text{ when } f(x,y) > f_0$$

where $C_1$, $f_{min}$ and $f_{max}$ are constants.

4. A method for producing and displaying a diagnostic ultrasound image comprising the steps of:

directing pulses of ultrasound energy into a body and detecting echoes of the energy which are reflected from structures within the body;

producing a first signal which corresponds to the instantaneous amplitude of the detected echoes;

producing a second signal which corresponds to the deviation of the instantaneous frequency of said echoes from a reference frequency;

producing an image in which each pixel maps the location of the point of original of a corresponding echo within the body;

modulating the intensity of each pixel with the first signal produced from the corresponding echo;

modulating the hue of each pixel with a first color when the second signal produced from the corresponding echo is greater than zero and with a second color when the second signal produced from the corresponding echo is less than zero; and modulating the saturation of each pixel as a function of the absolute value of the second signal produced from the corresponding echo.

5. The method of claim 4 wherein the first color is red and the second color is blue.

6. A method for producing an image for visualizing two independent parameters in a view comprising the steps of:

modulating the intensity of pixels of an image in accordance with the value of a first parameter at a corresponding location in the scene;

modulating the hue of said pixel to a first color when the value of the second parameter at a corresponding location in the scene is greater than a reference value and modulating the hue of said pixel to a second color when the value of the second parameter is less than the reference value; and modulating the saturation of the color of the pixel in proportion to the absolute value of the deviation of the second parameter from the reference value at the corresponding location.

7. The method of claim 6 where the view is a diagnostic image of a portion of a human body.

8. The method of claim 7 where the first parameter is the amplitude of ultrasound pulse echoes and the second parameter is the instantaneous frequency of the echoes.

* * * * *

UNITED STATES PATENT AND TRADEMARK OFFICE
CERTIFICATE OF CORRECTION

PATENT NO. : 4,690,150

DATED : September 1, 1987

INVENTOR(S) : WILLIAM T. MAYO, JR.

It is certified that error appears in the above-identified patent and that said Letters Patent is hereby corrected as shown below:

IN THE CLAIMS:

Claim 6, lines 6 and 9, change "scene" to --view--.

Signed and Sealed this

Fifth Day of January, 1988

Attest:

DONALD J. QUIGG

*Attesting Officer*  *Commissioner of Patents and Trademarks*